United States Patent
Malone (10) Patent No.: US 10,559,972 B2
(45) Date of Patent: *Feb. 11, 2020

(54) TWO-TIER BATTERY SOLUTION FOR DATA CENTER BACKUP

(71) Applicant: Google LLC, Mountain View, CA (US)

(72) Inventor: Christopher G. Malone, Mountain View, CA (US)

(73) Assignee: Google LLC, Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/950,852

(22) Filed: Apr. 11, 2018

(65) Prior Publication Data

US 2018/0233946 A1 Aug. 16, 2018

Related U.S. Application Data

(63) Continuation of application No. 14/959,231, filed on Dec. 4, 2015.

(51) Int. Cl.
*H02J 9/00* (2006.01)
*H02J 7/00* (2006.01)
(Continued)

(52) U.S. Cl.
CPC ................ *H02J 9/00* (2013.01); *G05B 15/02* (2013.01); *G05F 1/66* (2013.01); *G06F 1/263* (2013.01);
(Continued)

(58) Field of Classification Search
CPC ..... H02J 7/0003–0011; H02J 2009/007; H02J 2009/063; H02J 2009/067;
(Continued)

(56) References Cited

U.S. PATENT DOCUMENTS 5,549,984 A 8/1996 Dougherty
6,329,792 B1 12/2001 Dunn et al.
(Continued)

FOREIGN PATENT DOCUMENTS

| WO | 2013126800 | 8/2013 |
| WO | 2015/110566 | 7/2015 |
| WO | 204696782 | 10/2015 |

OTHER PUBLICATIONS

Mary Mazzoni, "3p Weekend: 7 Things You Need to Know About Tesla's New Home Battery", Triple Pundit, retrieved from <http://www.triplepundit.com/2015/05/3p-weekend-7-things-you-need-to-know-about-teslas-home-battery/>, May 1, 2015, 10 pages.

(Continued)

*Primary Examiner* — Patrick C Chen
(74) *Attorney, Agent, or Firm* — Fish & Richardson P.C.

(57) ABSTRACT

Methods, systems, and apparatus, including for back-up power sources. In one aspect, a method includes providing a plurality of first battery devices, each first battery device respectively electrically coupled to a respective server rack in a plurality of server racks and having a respective capacity to provide power to the respective rack for a power anomaly for up to a first duration. Providing a second battery device electrically coupled to the plurality of server racks and having a capacity to provide power to the plurality of respective server racks for a power anomaly for up to a second duration, wherein the second duration is longer than the first duration. A power anomaly is a deviation of mains power from one or more of a nominal supply voltage and frequency.

16 Claims, 4 Drawing Sheets

(51) Int. Cl.
  *H02J 9/06* (2006.01)
  *G06F 1/26* (2006.01)
  *G05F 1/66* (2006.01)
  *H05K 7/14* (2006.01)
  *G05B 15/02* (2006.01)

(52) U.S. Cl.
  CPC ............... *H02J 7/00* (2013.01); *H02J 9/062* (2013.01); *H05K 7/1485* (2013.01); *H02J 2007/0067* (2013.01)

(58) Field of Classification Search
  CPC ........ H02J 2009/068; H02J 9/00; H02J 9/062; G06F 1/263; G05B 15/02; G05F 1/66; G05F 1/67; H05K 7/1475; H05K 7/1477; H05K 7/1478; H05K 7/1479
  See application file for complete search history.

(56) References Cited

U.S. PATENT DOCUMENTS

| | | | |
|---|---|---|---|
| 7,141,894 B2 | 11/2006 | Kraus | |
| 7,196,495 B1 | 3/2007 | Burcham | |
| 7,589,436 B2 | 9/2009 | Takahashi et al. | |
| 7,980,905 B2* | 7/2011 | Rembach | B63H 21/20 440/6 |
| 9,614,374 B2* | 4/2017 | Patel | H02J 3/28 |
| 2005/0134239 A1 | 6/2005 | Harris et al. | |
| 2006/0133181 A1 | 6/2006 | Amano | |
| 2011/0223450 A1 | 9/2011 | Horne et al. | |
| 2011/0316338 A1* | 12/2011 | Peterson | G06F 1/263 307/29 |
| 2012/0134090 A1* | 5/2012 | Peng | G06F 1/189 361/679.31 |
| 2012/0313437 A1 | 12/2012 | Latham | |
| 2013/0080793 A1* | 3/2013 | Familiant | G06F 1/26 713/300 |
| 2013/0120929 A1 | 5/2013 | Bianculli et al. | |
| 2015/0032301 A1 | 1/2015 | Lamba | |
| 2015/0097663 A1 | 4/2015 | Sloo et al. | |
| 2015/0180233 A1 | 6/2015 | Yamada et al. | |

OTHER PUBLICATIONS

Robert McFarlane, "TechWatch: Why your data center might need a fuel cell generator", TechTarget, retrieved from <http://searchdatacenter.techtarget.com/feature/TechWatch-Why-your-data-center-needs-a-fuel-cell-generator>, Jan. 2014, 7 pages.

Rich Miller, "Microsoft: We're Eliminating Backup Generators", Data Center Knowledge, retrieved from <http://www.datacenterknowledge.com/archives/2012/09/17/microsoft-were-eliminating-backup-generators/>, Sep. 17, 2012, 8 pages.

Extended European Search Report issued in European Application No. 16199381.1, dated Apr. 5, 2017, 9 pages.

* cited by examiner

TWO-TIER BATTERY SOLUTION FOR DATA CENTER BACKUP

CROSS-REFERENCE TO RELATED APPLICATION

This application is a continuation application of U.S. application Ser. No. 14/959,231, filed Dec. 4, 2015, now allowed, which is incorporated by reference.

BACKGROUND

This specification relates to backup power sources.

Data center facilities are often used by providers to deliver Internet services to users. A data center, such as a server farm, typically contains thousands of server processing devices. Within the data centers the processing devices are arranged in racks, and each rack may contain dozens of servers. Assuming the power required for a single rack may be in the order of 50 kW, and that there may be hundreds of racks in a data center, it is not uncommon for a data center to have a power requirement on the order of megawatts.

Data center facilities range in critical levels according to the cost of down time to a business that utilizes the particular data center, the cost of ownership for the data center, and other factors. Typically, a data center facility includes redundant power systems to provide power to the server in the event of a power anomaly (e.g., blackout from utility provider, unstable utility power, etc.). Data center facilities utilize in-rack batteries and diesel generators to provide back-up power during a power anomaly. In-rack batteries are sized as small as possible to cover short-durations and minimize cost and size of the battery. The diesel generators are designed to provide power for longer-duration power anomalies. The determination of which source provides power during the power anomaly is dependent upon the duration of the power anomaly.

SUMMARY

In general, one innovative aspect of the subject matter described in this specification can be embodied in methods that include the actions of a providing a plurality of first battery devices, each first battery device respectively electrically coupled to a respective server rack in a plurality of server racks and having a respective capacity to provide power to the respective rack for a power anomaly for up to a first duration. Providing a second battery device electrically coupled to the plurality of server racks and having a capacity to provide power to the plurality of respective server racks for a power anomaly for up to a second duration, wherein the second duration is longer than the first duration. A power anomaly is a deviation of mains power from one or more of a nominal supply voltage and frequency. Other embodiments of this aspect include corresponding systems, apparatus, and computer programs, configured to perform the actions of the methods, encoded on computer storage devices.

Particular embodiments of the subject matter described in this specification can be implemented so as to realize one or more of the following advantages. A utility grade second tier battery powers a data center with clean energy. The capacity of a second tier battery can be determined according to historical power anomaly data. Sizing the capacity of the second tier battery according to the historical power anomaly data enables the battery to be sufficiently sized to minimize costs and unused resources. Typically, the second tier battery does not require a start-up time. Thus, the second tier battery will be able to provide power near instantaneously, and thus the capacity of the rack batteries can be reduced relative to the capacity required for a diesel generator back up. Utilizing the second tier battery can also provide a zero emissions solution for providing long-term back up power. Running diesel generators to provide a supplemental load includes emitting pollutants into the air during the diesel generator's operation. During peak demand, the utility grade battery system can provide power back to the grid to realize additional cost savings. Also, the utility grade battery system can provide power back to the grid for grid frequency regulation by supplying supplemental power to correct a gird frequency imbalance. Finally, because a diesel generator system must be sized for peak capacity of the data center without regard to likely outage duration, a diesel generator system is often overdesigned in that it may provide power as long as it has fuel available. However, the sizing of a utility grade battery based on historical outages and durations enables the capacity of the utility grade battery to be tailored to the data center's specific and likely needs, which reduces costs associated with a system that would otherwise have wasted capacity that is unlikely to ever be used for a particular data center.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A system provides a back-up power system that includes a two-tier battery system that powers a load (e.g., industrial loads, data centers, server racks, etc.) for various time durations in response to a power anomaly. Typically, the first tier battery is capable of providing power for shorter duration (e.g., 1 minute, 5 minutes, 10 minutes, etc.) power anomalies. The second tier battery device, which can be a utility grade battery with a multiple mega-watt capacity, provides power to the load for power anomaly durations (e.g., 1 hour, 3 hours, 1 day, etc.) that are longer than durations that can be supported by the first battery.

The system enables the second battery to provide power to the load before the power capacity of the first battery expires. Thus, the system is configured to provide back-up power to the load without interrupting the power supplied to the load. A power anomaly profile can be generated by maintaining an anomaly historical database. The anomaly historical database can include information regarding the duration of each historical power anomaly experienced by the system. The capacity of the second battery device can be determined utilizing the power anomaly profile and based on the durations of the power anomalies. The capacity of the second battery device is designed such that the duration of power provided by the second battery device is longer than all of the durations within the power anomaly profile.

Figure 1:
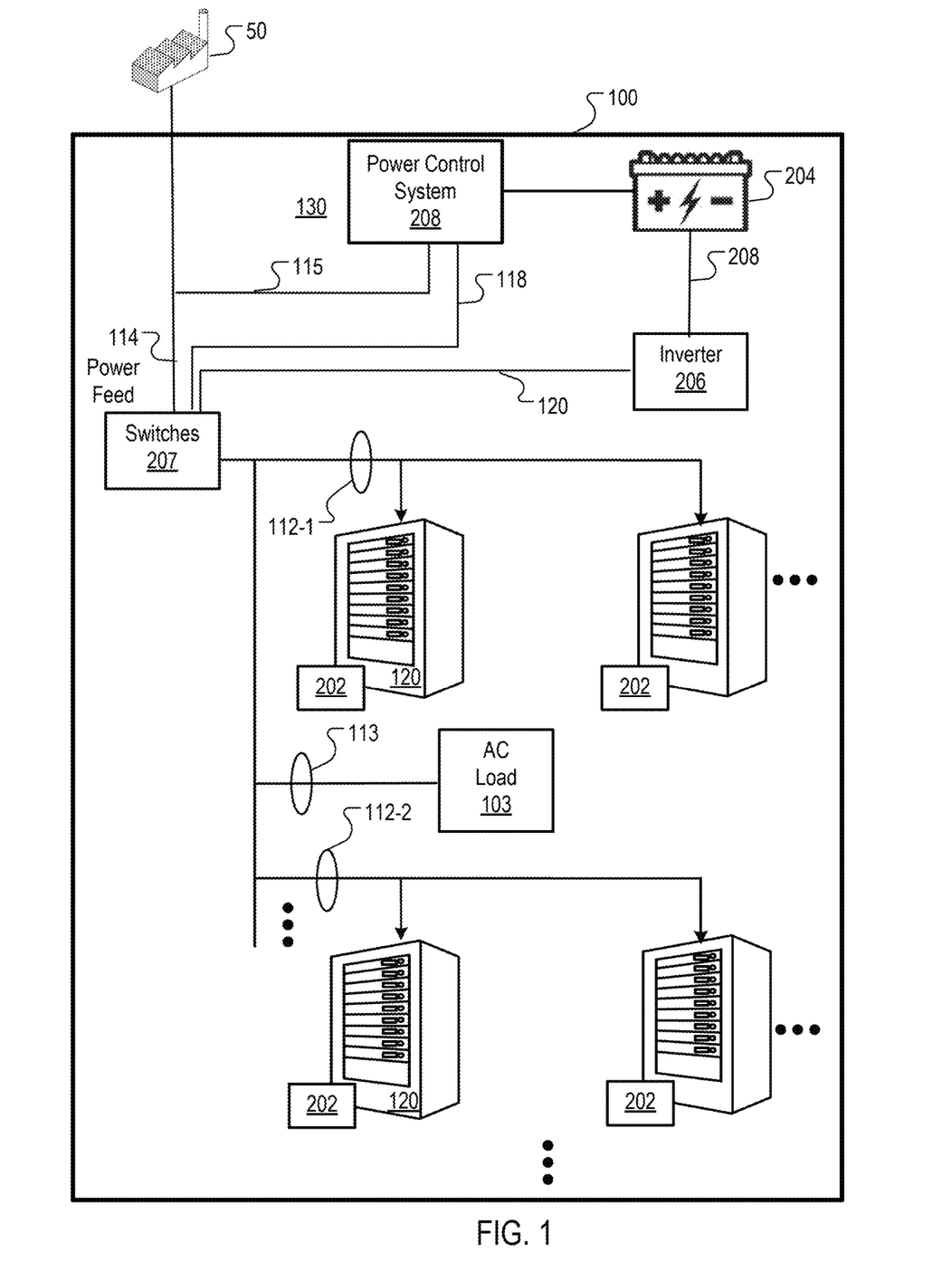
FIG. 1 is a block diagram illustration data center facility with an incorporated two tier battery system.

FIG. 1 is a block diagram of a data center facility 100 with two-tier battery system. The facility 100 can occupy one or more rooms within a building or essentially an entire building. The facility 100 is sufficiently large for installation of numerous (e.g., dozens or hundreds or thousands) alternating current devices, such as racks 120 of computer equipment, and other loads that collectively constitute a load. Examples of the latter include motors, chillers, AC lighting, etc.

The racks 120 of mounted computers are arranged in rows and are separated by aisles. Each rack 120 includes multiple processing devices. In general, each processing device includes a motherboard, on which a variety of computer-related components are mounted. The facility 100 includes other computer and routing devices (not shown) to connect the facility to a network, such as the Internet.

The facility 100 is also connected to an AC power feed 114 that provides power from a utility provider 50 to power the racks 120. Although one three phase feed is shown, the features described below can also be applied to situations in which two or more multi-phase feeds are used to provide power to a facility. In some implementations, the AC power feed 114 couples to each isle of racks utilizing an AC power feed branch 112-1, 112-2, etc.

Each rack includes an AC to DC converter (not shown) that converts AC power to DC power for use by the racks 120. As each rack 120 may house, for example, up to 100 processing devices, each rack 120 may individually consume on the order of 50 kW of power.

The facility 100 can also include an AC load 103 that utilizes AC power received from the AC feed 114. The AC load 103 includes various AC loads that are integrated into the facility 100. For example, the AC load 103 can include lighting, security systems, other computer and routing devices (not shown), motors, chillers and other loads that are part of the facility infrastructure.

A two tier battery system provides a back-up power source for the facility in the event of a power anomaly. A power anomaly is a deviation of mains power from one or more of a nominal supply voltage and frequency. For example, a power anomaly can include a power outage, a voltage sag in excess of a threshold on the power line, a reduction in the amount of power delivered to the facility 100, and any other power disturbance of the like.

The example power topology that will be described is illustrative only, and other appropriate power distribution topologies can be used. In some implementations, the two tier battery system includes first battery devices 202, each in a respective rack 120, a second battery device 204, an inverter 206, switches 207 and a power control system 208.

Each first battery device is respectively electrically coupled to a respective server rack 120 in a plurality of server racks 120 and has a respective capacity to provide power to the respective rack 120 for a power anomaly for up to a first duration. For example, in the event of a power anomaly each first battery 202 provides power to its respective server rack 120 for up to a first duration. Typically, the first duration is a short duration (e.g., 1 minute, 5 minutes, 10 minutes, etc.), that is selected to handle transient power anomalies in which power is not lost for period of time in excess of the first duration.

The power control system 208 monitors the power anomaly by a monitor line input 115. Should the duration begin to approach the first duration, the power control system 208, before the first duration expires, will utilize the switches 207 by means of a control line 118 to isolate the data center 100 from the power feed 114 and provided power from the second battery device 204 and the inverter 206. The second battery device 204 has a capacity to provide power to the plurality of respective server racks 120 and the AC load 103 for a power anomaly for up to a second duration (e.g., 1 hour, 3 hours, 1 day, etc.).

The second duration, which of course is longer than the first duration, is selected so that it is long enough to provide power to the data center facility 100 for long-term power anomalies that are likely to be experienced. This typically requires the second battery device 204 to have a battery capacity of at least one mega-watt hours. How the second duration is selected is described with reference to FIGS. 3 and 4 below.

In some implementations, the second battery device 204 can be a lithium ion battery system with a capacity of at least one mega-watt hour. Other types of batteries can also be used.

The inverter 206 converts the DC power provided by the battery 204 to AC power to provide the necessary power to the data center 100. In some implementations, the other AC loads 103 are also powered by the second battery device 204.

In some implementations, the power control system 208 includes a battery charger to charge the second battery device. Typically the second battery 204 is charged by the power feed 114 and the charging system that is integrated into the power control system. Other charging sources and topologies can also be used, however.

Once the power on the power feed 114 is within normal operating parameters, the power control system 208, again by means of the control line 118, utilizes the switches 207 to restore power from the power feed 114.

Figure 2:
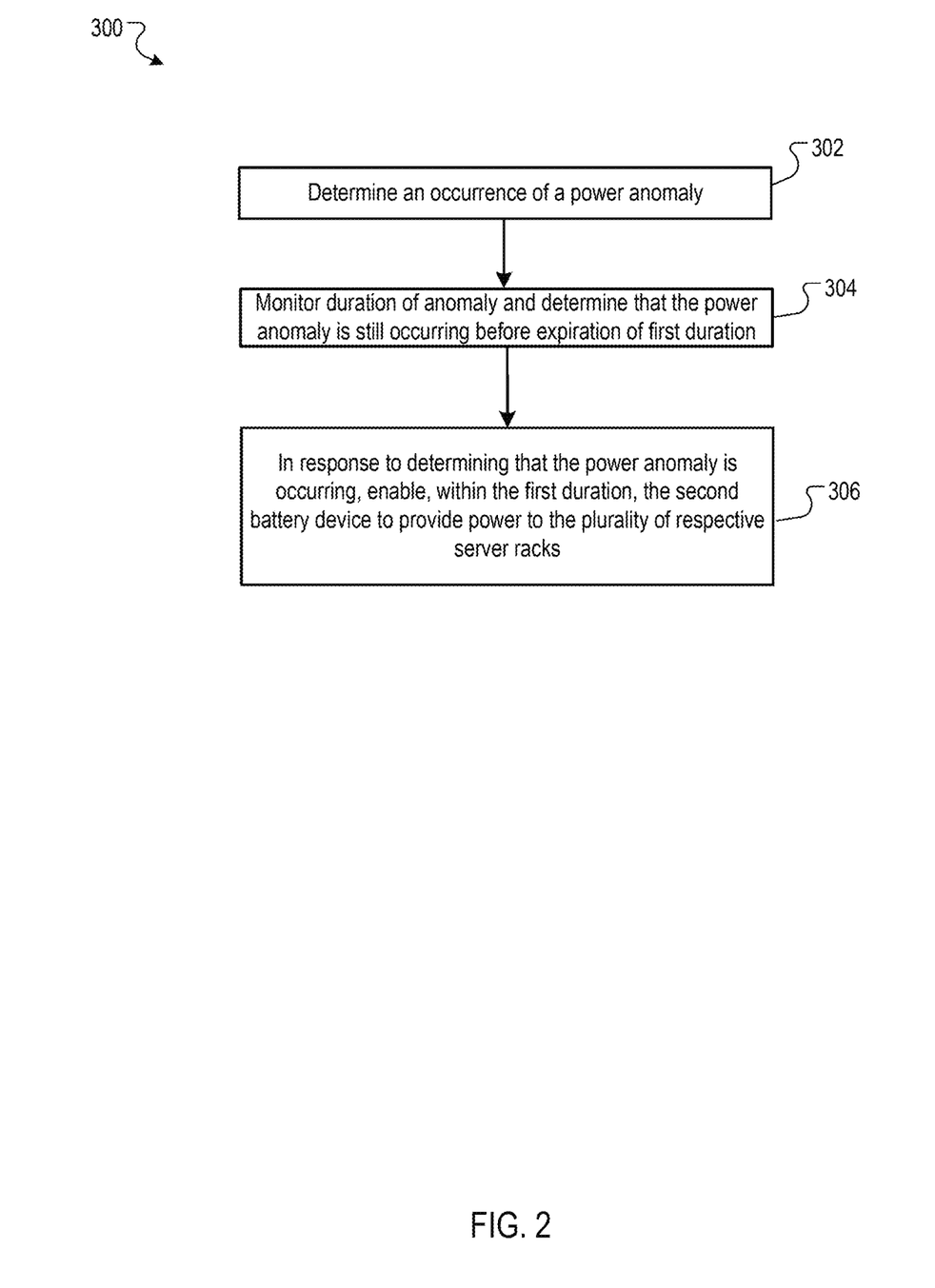
FIG. 2 is a flow diagram describing a process for operating the two tier battery system.

FIG. 2 is a flow diagram describing a process 300 for operating the two tier battery system 200.

The process determines an occurrence of a power anomaly (302). A power anomaly can be determined by the power control system 208 using various instruments (e.g., voltage monitoring sensor, current monitoring sensor, and other mechanisms of the like). The power anomaly is determined to occur when the input power provided by the utility is not within acceptable operational rages, e.g., +/−5% of a specified voltage, etc.

Upon determining the occurrence of the power anomaly, the power control system 208 will monitor the duration of the power anomaly and determines that the anomaly is still occurring before the expiration of the first time period. For example, if the first duration is 1 minute, then after 30 seconds the power control system 208 may determine whether the anomaly is still present.

If the anomaly is still present, then the power control system 2208 enables, within the first duration, the second battery device 204 to provide power to the plurality of respective server racks 120 (306). For example, the power control system 208 can activate the switches 207 that isolate the data center 100 from the power feed 114 and enables the first battery 202 to provide power to the racks 120 and AC load 103. In some implementations, the first battery 202 may be integrated into the circuit such that the first battery 202 automatically provides power to the facility 100 without activating a switch when the power control system 208 has determined that a power anomaly has occurred.

Other conditions can be used to enable power from the second battery system 204. For example, for any power anomaly detected, the power control system 208 may automatically switch the data center 100 to the second battery device 204.

Selecting the first duration is based, in part, on a determined response time to cause the second battery device 204 to provide power to the plurality of respective server racks 120. For example, if the power control system 208 and the switches 207 require 30 seconds to enable the second battery device 204 to provide power to the facility, the first duration for the first batteries 202 may be selected to be at least 30 seconds, e.g., 45 seconds or some other time that is in excess of 30 seconds to ensure that the first batteries 202 will not be depleted before the second battery device 204 is providing power to the data center 100. Thus the first duration of the first battery device 202 is selected to be at least sufficiently long enough to enable coupling to power by the second battery device 204, which ensures that back-up power is delivered to the facility without interruption.

Selecting the second duration may be done based, in part, on a historical analysis of anomalies. Based on the historical analysis, the second duration is selected according to a likelihood threshold that quantifies the likelihood of a power anomaly exceeding the second duration. For example, if the data center 100 is to be designed such that the likelihood the capacity of the second battery device 204 is 0.1%, then the second duration is a duration that, according to a historical model, is likely to occur only at a rate of 0.1%. From this second duration, the capacity of the second battery device 204 can then be determined.

In some implementations, the power control system 208 tracks and records power anomalies to create and maintain a power anomaly profile that includes historical statistics. Alternatively, a power anomaly profile may be provided by the utility provider, if available. In some implementations, the capacity of the second battery device 204 can be determined based on the historical statistics provided by power anomaly profile.

Figure 3:
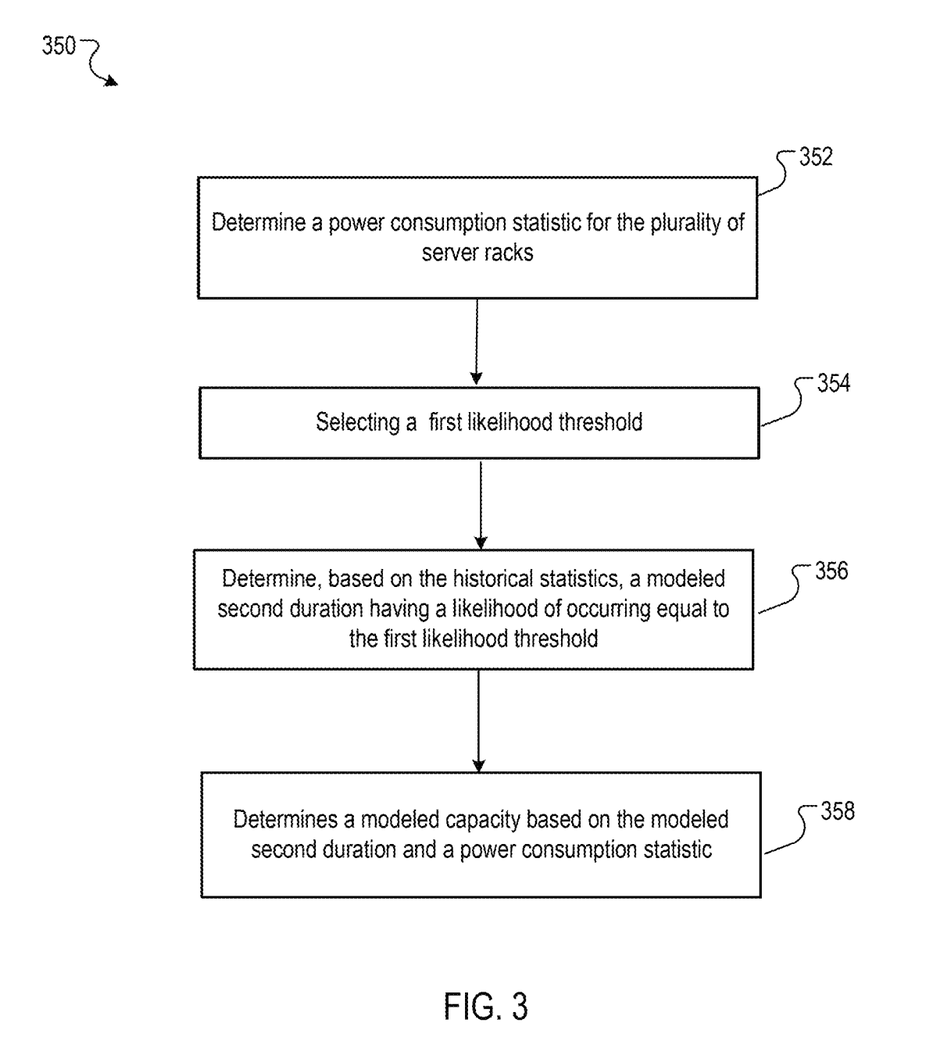
FIG. 3 is a flow diagram describing a process for determining a second duration and a capacity for a battery device.

FIG. 3 is a flow diagram describing a process 350 for determining a second duration and a corresponding capacity for a battery device. The process 350 can be done in the power control system, or in any appropriate data processing apparatus.

The process 350 determines a power consumption statistic for the plurality of server racks (352). For example, the power consumption of the server racks for a data center can be determined (or, alternatively, the power consumption of the entire data center itself). The statistic can be provided by the utility provider, or measured at the data center 100. For example, the amount of power consumed for a predetermined amount of time can be used to determine an energy rating, e.g., X kW/H, or Y MW/H, etc.

A first likelihood threshold is selected (354), and the process determines, based on the historical statistics, a second duration have a likelihood of occurring equal to the first likelihood threshold (356). The first likelihood threshold can be a measure of the likelihood for a power anomaly to occur for a particular length of time based on the historical statistics. For example, assume a power anomaly profile provided by a utility provider (or determined by the data center 100) indicates that the likelihood of a power anomaly for a given duration D in excess of 1 hour is expressed by the following regression:

$$P(D) = (0.4 * \exp(D))^{-1}$$

Assume that the data center is designed to have only a 0.1% chance depleting the capacity of a fully charged second battery system. The first likelihood threshold is thus 0.1%, which, in turn, corresponds to a duration of approximately 7.82 hours. Thus, a designer of the second battery system would select a second duration of at least 7.82 hours or greater when the first likelihood threshold is 0.1%.

The process 350 determines, based on the modeled second duration and power consumption statistics, a modeled capacity (358). For example, assume the power consumption for the data center is 500 KWH, and the designer selected 8 hours as the second duration. The capacity of the second battery device 204 is thus 4 MWH. The capacity of the second battery device 204 is chosen to provide sufficient power to the data center 100 for the duration of forecasted power anomalies.

In some instances, the power grid may become stressed (e.g., experience a voltage drop, a lack of current being provided by the power from the power grid, etc.) because the demand for power approaches the maximum amount of power generated by the power utility 50. The data center 100 can, in some situations, provide demand response power back into the grid from the second battery device 204. In other instances, the power grid frequency may incur a frequency imbalance due to fluctuating load demands. The data center's second battery device 204 can provide requisite power to the power grid to balance the power grid frequency.

Figure 4:
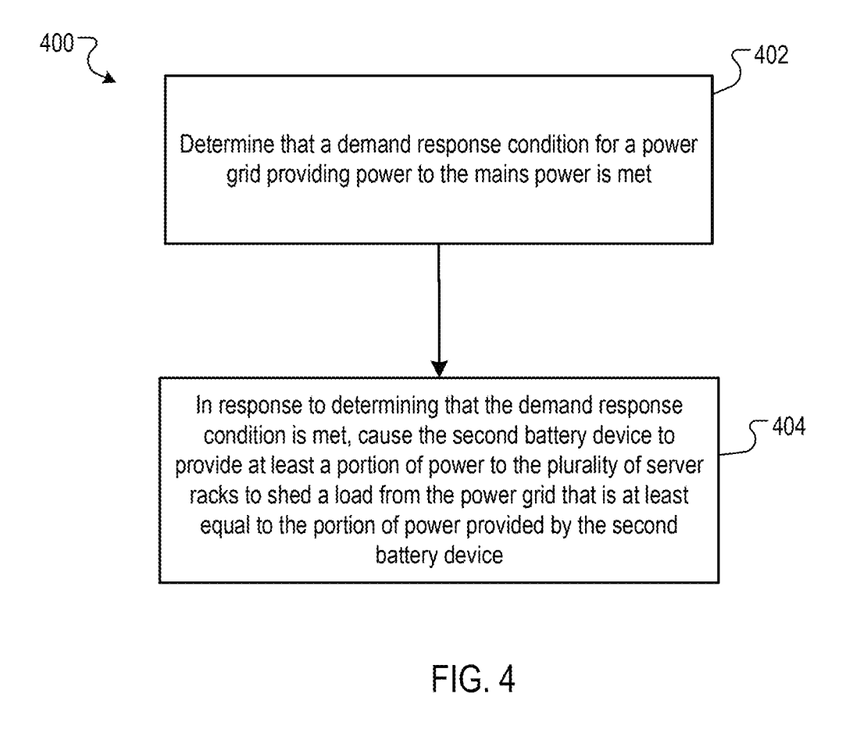
FIG. 4 is a flow diagram describing a process for shedding load from the utility and providing supplemental power from the two tier battery system.

FIG. 4 is a flow diagram describing a process 400 for shedding load from the utility and providing supplemental power from the two tier battery system. The power control system 208 can determine that a demand response condition for a power grid providing power to the mains power is met (402). The demand response condition for the power grid can be an over demand condition for the power grid or the power grid reaching a critical power delivery state where the demand for power is close to or has met the amount of power that is available for consumption on the power grid. The control system 208 can be notified by the utility of the demand condition being met.

In response to determining that the demand response condition is met, the power control system 208 causes the second battery device 204 to provide at least a portion of power to the plurality of server racks 120 to shed a load from the power grid that is at least equal to the portion of power provided by the second battery device 204 (404). For example, the power control system 208 allows the second battery device 204 to provide power to approximately 50% percent of the load of the data center 100. This reduces the overall load of the data center as seen from the grid by 50%.

In some implementations, the demand response may be condition on likelihood that a power anomaly will not be observed during the demand response time. This is to ensure that the battery device 204 does not deplete its charge during by providing demand response relief when the likelihood of experiencing a power anomaly during this time is unacceptably high.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

The operations described in this specification can be implemented as operations performed by a data processing apparatus on data stored on one or more computer-readable storage devices or received from other sources.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system, comprising:
    a plurality of first batteries, each first battery respectively electrically coupled to a respective server rack in a plurality of server racks and having a respective capacity to provide power to the respective server rack for a first power anomaly for up to a first duration;
    a second battery electrically coupled to the plurality of server racks and having a capacity to provide power to the plurality of respective server racks for a second power anomaly for up to a second duration, wherein the second duration is longer than the first duration, wherein each power anomaly is a deviation of mains power from one or more of a nominal supply voltage and frequency; and
    a power control system operable to perform operations comprising:
        determining, for the plurality of server racks and based on observed power anomalies, a power anomaly profile that describes historical statistics of the observed power anomalies;
        determining, for the plurality of server racks and based on the power anomaly profile, a likelihood threshold that quantifies a likelihood of any future power anomaly exceeding the second duration; and
        selecting the capacity of the second battery based on the historical statistics of the observed power anomalies and power consumption statistic for the plurality of server racks such that a likelihood of the second battery to provide power to the plurality of server racks for a duration of any future power anomaly meets the determined likelihood threshold.

2. The system of claim 1, wherein the power control system is further operable to perform operations comprising:
    determining that the first power anomaly is occurring; and
    in response to determining that the first power anomaly is occurring, enabling, within the first duration, the second battery to provide power to the plurality of respective server racks.

3. The system of claim 2, wherein the power control system is further operable to perform operations comprising:

determining a response time of the power control system to cause the second battery to provide power to the plurality of respective server racks; and selecting the first duration based, in part, on the response time.

4. The system of claim 1, wherein the second battery has a battery capacity of at least one mega-watt hours.

5. The system of claim 1, wherein the power control system is further operable to perform operations comprising:
determining that a demand response condition for a power grid providing power to the mains power is met; and
in response to determining that the demand response condition is met, causing the second battery to provide at least a portion of power to the plurality of server racks to shed a load from the power grid that is at least equal to the portion of power provided by the second battery.

6. The system of claim 1, further comprising a switch to electrically couple the second battery to the power grid, wherein the power control system is further operable to perform operations comprising:
determining that the first power anomaly is occurring; and
in response to determining that the first power anomaly is occurring, enabling the switch to enable the second battery to provide power to the power grid.

7. The system of claim 1, wherein each power anomaly includes a power grid frequency imbalance, a voltage drop on the power grid, or a lack of adequate current within the power provided by the power grid.

8. A system, comprising:
a plurality of first batteries, each first battery respectively electrically coupled to a respective server rack in a plurality of server racks and having a respective capacity to provide power to the respective server rack for a first power anomaly for up to a first duration;
a second battery electrically coupled to the plurality of server racks and having a capacity to provide power to the plurality of respective server racks for a second power anomaly for up to a second duration, wherein the second duration is longer than the first duration, wherein each power anomaly is a deviation of mains power from one or more of a nominal supply voltage and frequency; and
a power control system operable to perform operations comprising:
determining, for the plurality of server racks and based on observed power anomalies, a power anomaly profile that describes historical statistics of the observed power anomalies; and
selecting a capacity of the second battery based on the historical statistics of the observed power anomalies such that a likelihood of the second battery to provide power to the plurality of server racks for a duration of any future power anomaly meets a likelihood threshold;
wherein selecting the capacity of the second battery based on the historical statistics comprises:
determining a power consumption statistic for the plurality of server racks;
selecting the likelihood threshold;
determining, based on the historical statistics, a modeled second duration having a likelihood of occurring equal to the likelihood threshold;
determining, based on the modeled second duration and the power consumption statistic, a modeled capacity; and
selecting the modeled capacity as the capacity for the second battery.

9. A method, comprising:
providing a plurality of first batteries, each first battery respectively electrically coupled to a respective server rack in a plurality of server racks and having a respective capacity to provide power to the respective server rack for a first power anomaly for up to a first duration;
providing a second battery electrically coupled to the plurality of server racks and having a capacity to provide power to the plurality of server racks for a second power anomaly for up to a second duration, wherein the second duration is longer than the first duration, wherein each power anomaly is a deviation of mains power from one or more of a nominal supply voltage and frequency;
determining, for the plurality of server racks and based on observed power anomalies, a power anomaly profile that describes historical statistics of the observed power anomalies;
determining, for the plurality of server racks and based on the power anomaly profile, a likelihood threshold that quantifies a likelihood of any future power anomaly exceeding the second duration; and
selecting the capacity of the second battery based on the historical statistics of the observed power anomalies and power consumption statistic for the plurality of server racks such that a likelihood of the second battery to provide power to the plurality of server racks for a duration of any future power anomaly meets the determined likelihood threshold.

10. The method of claim 9, further comprising:
determining that the first power anomaly is occurring; and
in response to determining that the first power anomaly is occurring, enabling, within the first duration, the second battery to provide power to the plurality of respective server racks.

11. The method of claim 10, further comprising:
determining a response time of a power control system to cause the second battery to provide power to the plurality of respective server racks; and
selecting the first duration based, in part, on the response time.

12. The method of claim 9, wherein the second battery has a battery capacity of at least one mega-watt hours.

13. The method of claim 9, further comprising:
determining that a demand response condition for a power grid providing power to the mains power is met; and
in response to determining that the demand response condition is met, causing the second battery to provide at least a portion of power to the plurality of server racks to shed a load from the power grid that is at least equal to the portion of power provided by the second battery.

14. The method of claim 9, further comprising:
determining that the first power anomaly is occurring; and
in response to determining that the first power anomaly is occurring, enabling a switch to enable the second battery to provide power to the power grid, wherein the switch electrically couples the second battery to the power grid.

15. The method of claim 9, wherein each power anomaly includes a power grid frequency imbalance, a voltage drop on the power grid, or a lack of adequate current within the power provided by the power grid.

16. A method, comprising:

providing a plurality of first batteries, each first battery respectively electrically coupled to a respective server rack in a plurality of server racks and having a respective capacity to provide power to the respective server rack for a first power anomaly for up to a first duration;

providing a second battery electrically coupled to the plurality of server racks and having a capacity to provide power to the plurality of server racks for a second power anomaly for up to a second duration, wherein the second duration is longer than the first duration, wherein each power anomaly is a deviation of mains power from one or more of a nominal supply voltage and frequency;

determining, for the plurality of server racks and based on observed power anomalies, a power anomaly profile that describes historical statistics of the observed power anomalies; and selecting the capacity of the second battery based on the historical statistics of the observed power anomalies such that a likelihood of the second battery to provide power to the plurality of server racks for a duration of any future power anomaly meets a likelihood threshold;

wherein selecting the capacity of the second battery based on the historical statistics comprises:

determining a power consumption statistic for the plurality of server racks;

selecting the likelihood threshold;

determining, based on the historical statistics, a modeled second duration having a likelihood of occurring equal to the likelihood threshold;

determining, based on the modeled second duration and the power consumption statistic, a modeled capacity; and selecting the modeled capacity as the capacity for the second battery.

\* \* \* \* \*